United States Patent [19]

Camarota et al.

[11] Patent Number: 4,910,712
[45] Date of Patent: Mar. 20, 1990

[54] MEMORY CELL WITH A PLURALITY OF PASS GATES

[75] Inventors: Rafael C. Camarota, San Jose; H. William Wang, Saratoga, both of Calif.

[73] Assignee: Saratoga Semiconductor Corporation, Cupertino, Calif.

[21] Appl. No.: 157,632

[22] Filed: Feb. 18, 1988

[51] Int. Cl.$^4$ .............................................. G11C 7/00
[52] U.S. Cl. .................................. 365/189.08; 365/154
[58] Field of Search ................ 365/154, 156, 189, 190, 365/202

[56] References Cited
U.S. PATENT DOCUMENTS 4,447,891  5/1984  Kadota .............................. 365/154

Primary Examiner—Joseph A. Popek
Attorney, Agent, or Firm—Fleisler, Dubb, Meyer & Lovejoy

[57] ABSTRACT

Disclosed is a memory cell which includes a plurality of pass gates in the read word and write word lines. The pass gates are connected in series and each pass gate is controlled by a separate line, namely, by a write word line or a read word line. By use of two or more pass gates in this manner, logical functions, such as logical AND functions are performed within the memory cell.

11 Claims, 5 Drawing Sheets

MEMORY CELL WITH A PLURALITY OF PASS GATES

BACKGROUND OF THE INVENTION

The present invention relates generally to memory circuits and particularly to memory cells capable of performing logical functions within the memory cell.

Conventional memory cells include a bi-stable latch circuit formed of cross-coupled MOS transistors. For stable operation, only one of the transistors is conducting while the other transistor is non-conducting. The cell is switched from storing a logical 1 to a logical 0 by reversing the non-conducting transistor to conducting and the conducting transistor to non-conducting in a conventional manner. The conducting path for one transistor connects from a reference (such as Vcc), along a conduction path through the transistor from drain to source to a sink such as ground. The conducting path for the complementary transistor is similarly from a reference along a conduction path through the other transistor from drain to source to a sink. The conduction path from one transistor is connected through one passing gate transistor to a write bit line, WB. Similarly, the conduction path for the same transistor is connected through another passing gate transistor to a read bit line, RB.

The complementary transistor of the latch has a complementary conduction path connected through a passing transistor to a write $\overline{bit}$ line, $\overline{WB}$. Another passing transistor connects the complementary conduction path to a read $\overline{bit}$ line $\overline{RB}$. The passing gates for both the write bit, WR, and write $\overline{bit}$, $\overline{WB}$, lines have their gates connected to a common write word line, WW. Similarly, the passing gates for the read $\overline{bit}$, RB, line and the read $\overline{bit}$, $\overline{RB}$, line have their gates connected in common to a read word, RW, line.

The conventional operation of a memory cell has a coincidence of write word, WW, line and write bit, WB, line signals to write into the latch circuit to store a logical 1 and the coincidence of the write word, WW, line and the write $\overline{bit}$, $\overline{WB}$, line to write a logical 0 into the latch circuit. In order to read from the latch circuit, the read word, RW, line is energized and complementary signals appear on the read $\overline{bit}$, RB, line and the read $\overline{bit}$, $\overline{RB}$, line.

In conventional memory cells, only one write word line and one read word line are provided. If more than one value is to be used to control a word line, either read or write, then external control logic, such as a logical AND, must be used externally to the memory cell. The external logic requires additional circuitry which requires additional area on a semiconductor chip and which causes additional delay in accessing the memory cell.

It is an object of the present invention to reduce the area required to do logical functions such as logical AND's and to increase the speed of memory cell operation.

SUMMARY OF THE INVENTION

The present invention is a memory cell which includes a plurality of pass gates in the read word and write word lines. The pass gates are connected in series and each pass gate is controlled by a separate line, namely, by a write word line or a read word line. By use of two or more pass gates in this manner, logical functions, such as logical AND and logical NOR functions are performed within the memory cell. By including such logical functions within the cell, the size of the cell is increased but such increase eliminates the need for certain external logical gates which perform logical functions in decoders outside the memory cell. Additionally, the elimination of external gates increases the speed of the overall memory unit comprised of the memory cell and the memory cell decode logic.

The foregoing and other objects, features and advantages of the invention will be apparent from the following detailed description in conjunction with the drawings.

DETAILED DESCRIPTION

Figure 1:
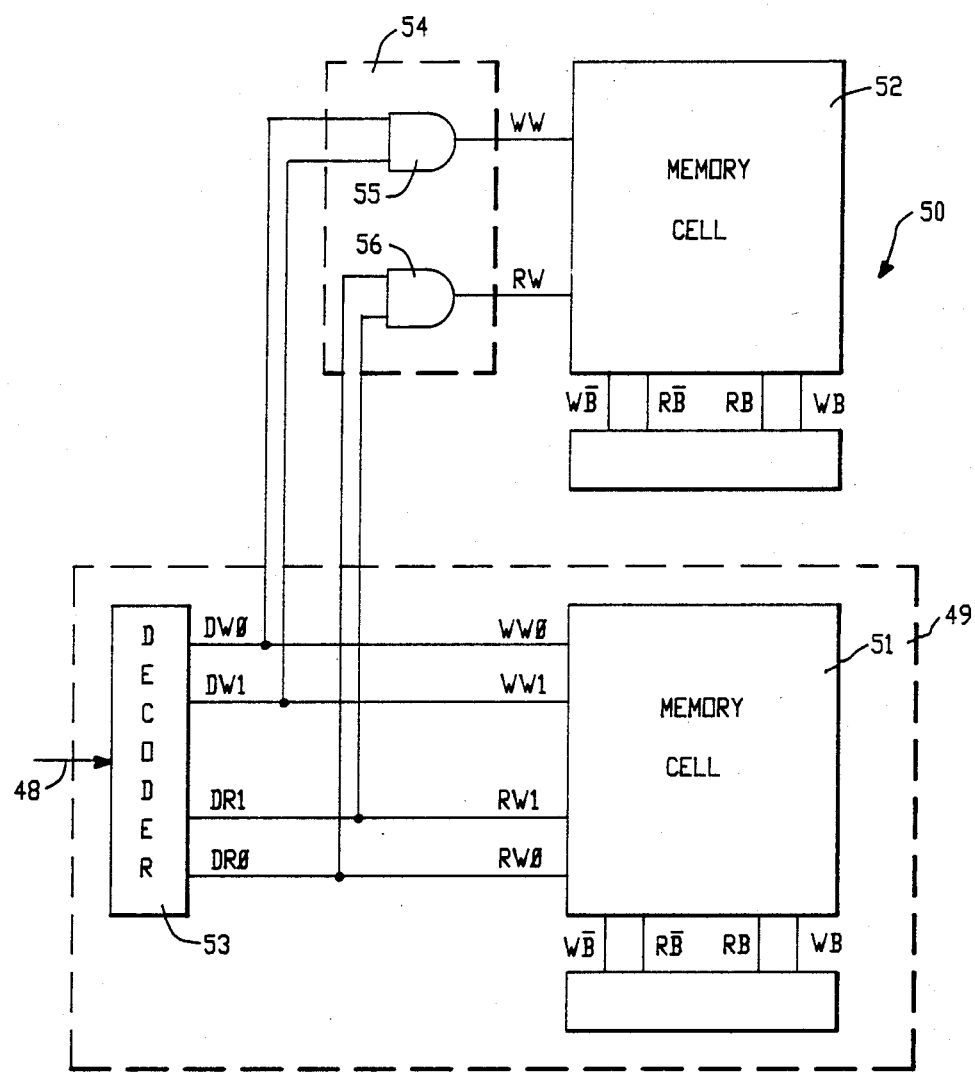
FIG. 1 depicts a schematic representation of a memory unit including a memory cell together with external logic.

In FIG. 1, a schematic representation of a memory unit 50 is shown. The memory unit includes a conventional memory cell 52 and an improved memory cell 51.

In FIG. 1, each of the memory cells 51 and 52 has write word lines WW and read word lines RW. The word lines for both cells 51 and 52 are controlled by external decoder logic 53. Additionally, the conventional cell 52 includes as the last decoder stage an additional decoder 54. The cell 52 includes a single write word WW line and a single read word RW line. Memory cell 52 also has write bit lines WB and $\overline{WB}$ and read bit lines RB and $\overline{RB}$.

The memory cell 51 includes two write word lines, WW0 and WW1, and two read word lines RW0 and RW1. The memory cell 51 also includes the bit lines including the write bit lines WB and $\overline{WB}$ and the read bit lines RB and $\overline{RB}$.

In FIG. 1, the decoder 53 receives input lines 48 and provides decoded outputs, namely the decoded write word outputs DW0 and DW1 and the decoded read word outputs DR0 and DR1. The DW0 and DW1 write word outputs, in the case of memory cell 51, connect directly to the write word lines WW0 and WW1, respectively. Similarly, the decoded read word outputs DR0 and DR, in the case of memory cell 51, connect directly to the read word lines WR0 and WR1, respectively.

In the case of memory cell 52, the decoded write word output DW0 and DW1 connect to the last stage decoder 54 and specifically to the AND gate 55. The single output from the AND gate 55 is the single write word line WW. Similarly, the decoded read word outputs DR0 and DR1 connect as an input to the AND gate 56 in the decoder 54. The output from the AND gate 56 is the read wordline RW.

It is apparent from FIG. 1 that the memory cell 51 does not require the last stage decoder 54 as does the memory cell 52. For that reason, memory unit 49 can operate faster than a memory unit including a conventional memory cell 52 with a last stage decoder 54.

Figure 2:
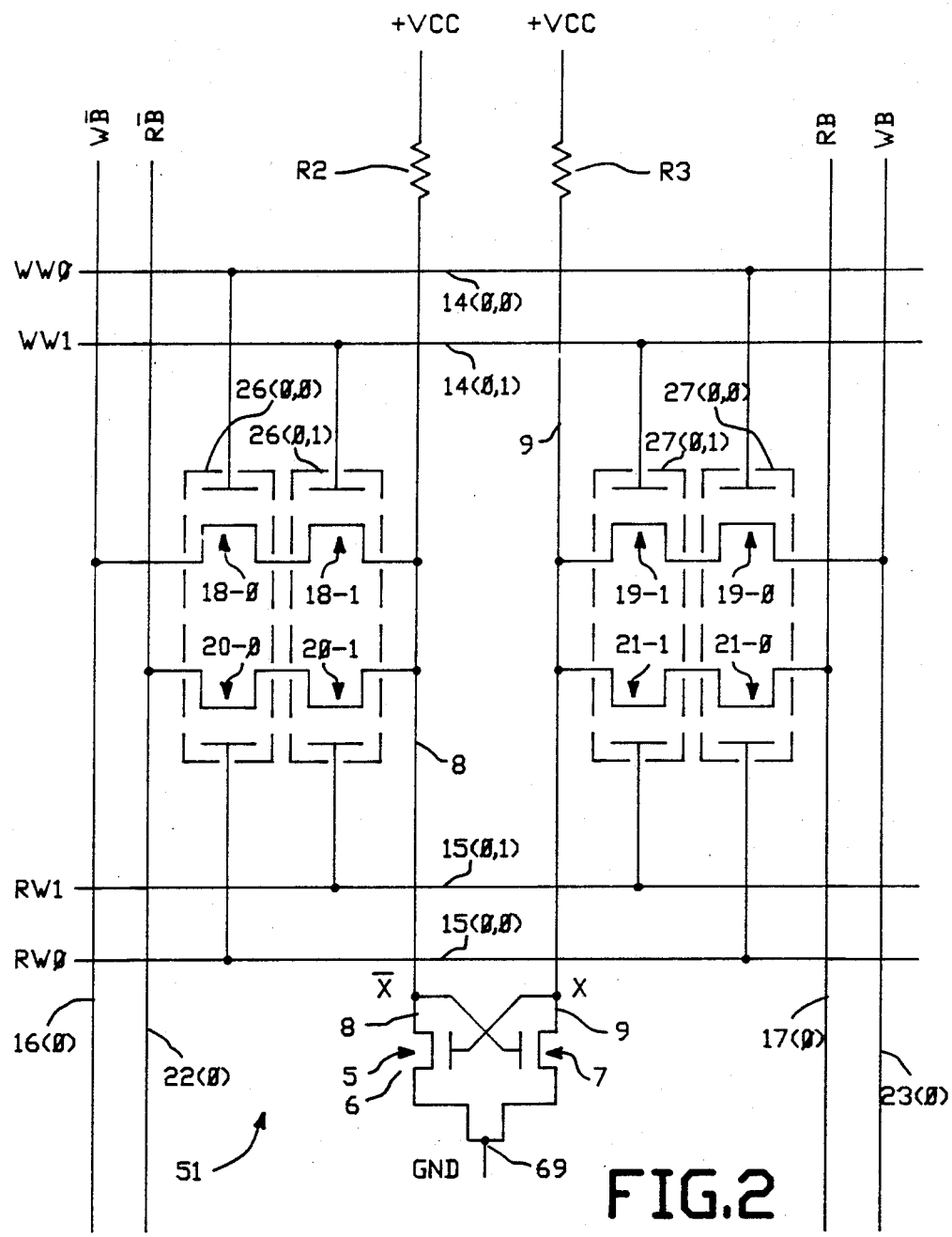
FIG. 2 depicts one embodiment of the present invention wherein dual word lines are employed and dual bit lines are employed for each memory cell.

In FIG. 2, the memory cell 51 includes a latch circuit 5 which stores a logical 1 or a logical 0. The latch 5 includes two unipolar transistors 6 and 7 having two logical points X and $\overline{X}$, respectively cross-coupled to the opposite gates, for transistors 7 and 6 respectively, in a conventional manner. The cross-coupled transistors form a bistable circuit with the logical signal values of X and $\overline{X}$ complementary, that is, logical 1 and logical 0. In a typical CMOS structure X and $\overline{X}$ are the drains of NMOS transistors.

Whenever the transistor 6 is non-conducting, the transistor 7 is conducting. When transistor 6 is non-conducting, the signal at $\overline{X}$ is high and a logical 1 while the signal on X is a logical 0. The logical 0 at X applied to the gate of transistor 6 holds transistor 6 non-conducting while the 1 from $\overline{X}$ to the gate of transistor 7 holds transistor 7 conducting. The conduction through latch 5 is along a first or second path. The first path extends from a source, Vcc, through resistor R2, along conductor 8 through transistor 6 drain to source to a common ground contact 69. The second path, the complementary path, extends from a source, Vcc, through resistor R3 to conductor 9 through transistor 7 drain to source to the common ground contact 69.

The logical 1 and 0 state at the X and $\overline{X}$ locations of transistors 6 and 7 can be switched by control of the word and bit lines.

In FIG. 2, the WW0 write word line 14(0,0) connects to the gate of transistor 18-0 in gate pair 26(0,0) and to the gate of transistor 19-0 in gate pair 27(0,0). Similarly, the WW1 write word line 14 (0,1) connects to the gates of transistor 18-1 in gate pair 26(0,1) and transistor 19-1 in gate pair 27(0,1). The transistors 18-0 and 18-1 are connected in series, source to drain, between a $\overline{WB}$ write bit line 16(0,0) and the first latch conductor 8. The transistors 19-0 and 19-1 are connected in series, source to drain, between the RB read bit line 17(0) and the second latch conductor 9.

In FIG. 2, the transistors 20-0 and 20-1 are connected in series, source to drain, between the $\overline{RB}$ read bit line 22(0) and the first latch conductor 8. The transistors 21-0 and 21-1 are connected in series, source to drain, between the WB write bit line 23(0) and the second latch conductor 9.

The operation of the cell of FIG. 2 is described in connection with the following Table 1. In order to write a logical 1 for X, both the WW0 and WW1 write word lines 14(0,0) and 14(0,1) are energized to render the gates 18-0 and 18-1 conducting and gates 19-0 and 19-1 conducting. Also the WB write bit line 23(0) is energized as a 1 so as to tend to drive latch conductor 9 toward 1 so that the current through transistor 6 is increased, thereby tending to turn the transistor 6 on. The $\overline{WB}$ write bit line 16(0) is energized as a logical 0 so as to tend to drive the latch conductor 8 toward 0 and the logical 0 at $\overline{X}$ tends to turn off the transistor 7, thereby storing the logical 1 in the cell 5 for X.

In order to write a 0 into the cell 5, then the word lines 14(0,0) and 14(0,1) are again both energized, together with the $\overline{WB}$ write bit line 16(0) a 1 and the WB write bit line 23(0) a 0.

TABLE 1

| WW0 | WW1 | WB | $\overline{WB}$ | X | $\overline{X}$ |
|---|---|---|---|---|---|
| | | Initial Conditioning = | | 1 | 0 |
| 1 | 1 | 1 | 0 | 1 | 0 |

TABLE 1-continued

| WW0 | WW1 | WB | $\overline{WB}$ | X | $\overline{X}$ |
|---|---|---|---|---|---|
| 1 | 0 | 1 | 0 | 1 | 0 |
| 0 | 1 | 1 | 0 | 1 | 0 |
| 0 | 0 | 1 | 0 | 1 | 0 |
| | | Initial Conditioning = | | 0 | 1 |
| 1 | 1 | 0 | 1 | 0 | 1 |
| 1 | 0 | 0 | 1 | 1 | 0 |
| 0 | 1 | 0 | 1 | 1 | 0 |
| 0 | 0 | 0 | 1 | 1 | 0 |

As can be understood from the above description, in order to store a 1 in the memory cell of FIG. 2, all the transistors 18-0, 18-1, 19-0, and 19-1 must be enabled conducting through the presence of signals on both the write word lines 14(0,0) and 14(0,1). Such an operation is the equivalent of a logical AND of the signals on the WW0 and WW1 word lines 14(0,0) and 14(0,1). Similarly, the writing of a 0 requires a logical AND of the signals on WW0 and WW1 word lines 14(0,0) and 14(0,1).

For a read operation, both the RW0 and RW1 read word lines 15(0,0) and 15(0,1) must be energized. When these read word lines are energized, the gates 20-0 and 20-1 and 21-0 and 21-1 are all enabled conducting. If transistor 6 is off, then $\overline{X}$ is a logical 1 and an output 1 signal appears on the $\overline{RB}$ read bit line 22(0,0). If the transistor 7 is non-conducting, then X is a logical 1 and an output 1 signal appears on the RB read bit line 17(0).

Figure 3:
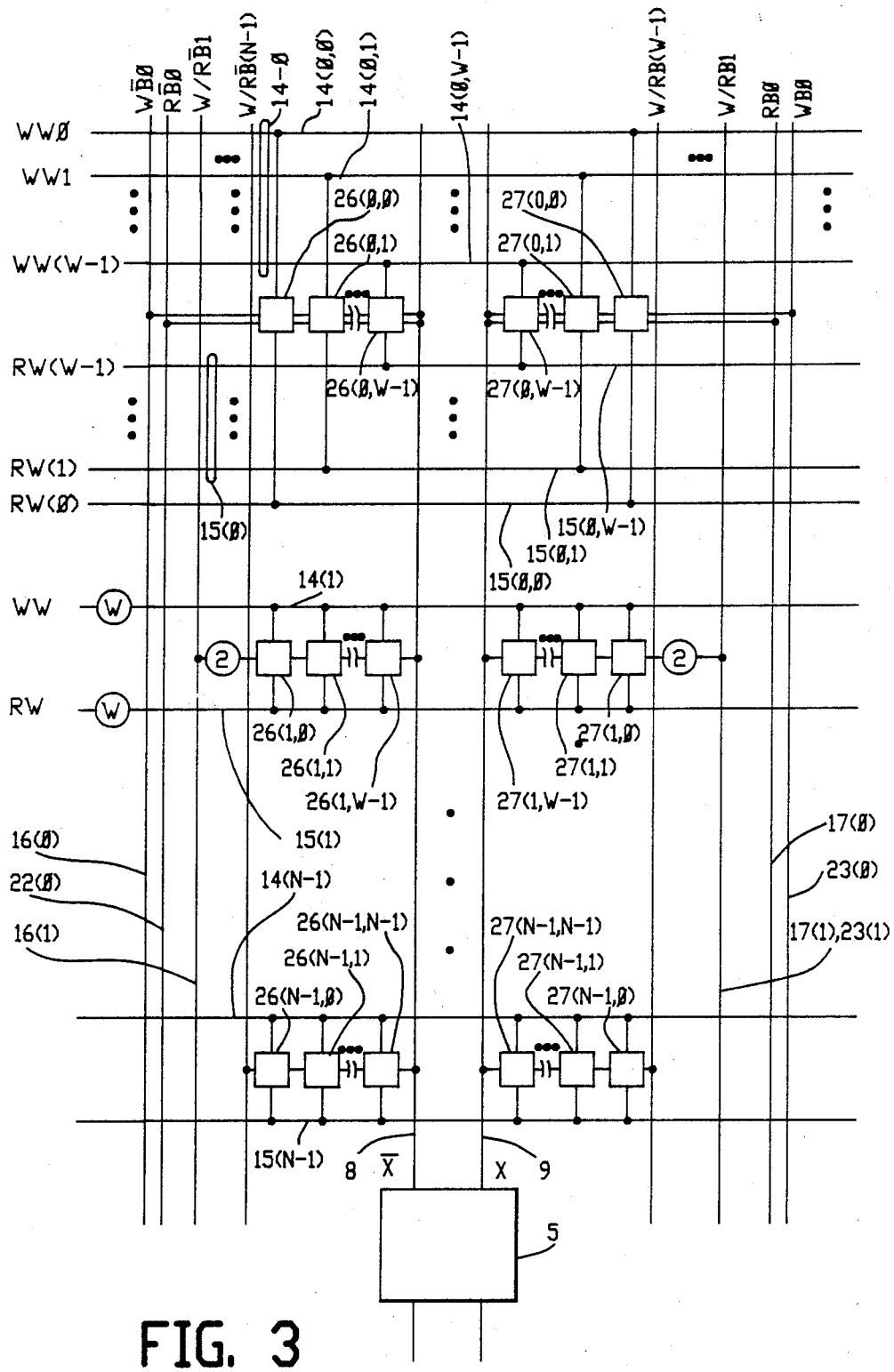
FIG. 3 is generalized embodiment of a cell with W word lines and B bit lines.

In FIG. 3, a memory cell having W word line pass gates and having N bit lines is shown. In FIG. 3, the gate pairs 26 are like the gate pairs 26 in FIG. 2. Similarly, the gate pairs 27 are like the gate pairs 27 in FIG. 2.

In FIG. 3, the number of pass gates, W, includes the pairs 26(0,0), 26(0,1), . . . , 26(0,W-1). These pass gates connect the $\overline{WB}$ write bit and $\overline{RB}$ read bit lines 16(0) and 22(0) and the latch first conductor 8. Similarly, the pass gate pairs 27(0,0), 27(0,1), . . . , 27(0,W-1) connect between the RB read bit and WB write bit lines 23(0,0) and 17(0,0). Each pass gate pair 26 is connected to a different one of the word lines 14(0). Specifically, the WW0 write word line 14(0,0) connects to the gate pair 26(0,0), the WW1 word line 14(0,1) connects to the pair 26(0,1) and so on until the WW(W-1) word line 14(0,W-1) connects to the pair 26(0,W-1).

In a similar manner, the write word lines 14(0,0), 14(0,1), . . . , 14(0,W-1) connect to the pairs 27(0,0), 27(0,1), . . . , 27(0,W-1), respectively.

In FIG. 3, a second row of pass gates 26(1,0), 26(1,1), . . . , 26(1,W-1) connected between a W/RB1 write/read bit line pair, including $\overline{WB}$1 write bit line 16(1) and 22(1), and the first latch conductor 8. In a similar manner, the pass gates 27(1,0), 27(1,1), . . . , 27(1,W-1) are connected in series between the W/RB1 write/read bit line airs, including WB1 write bit line 23(1) and RB1 read bit line 17(1), and the second latch conductor 9.

In FIG. 3, the N-1 row of pass gates includes the pass gate pairs 26(B-1,0) 26(N-1,1), . . . , 26(N-1,W-1) connected between the W/$\overline{RB}$(N-1) write/read bit line pair 16(N-1), 22(N-1). Similarly, the pass gates 27(N-1,0), 27(N-1,1), . . . , 27(N-1,W-1) connect between the W/RB(N-1) write/read bit lines 17(N-1), 23(N-1) and the Second latch conductor 9.

The operation of the FIG. 3 systems requires that all of the pass gates connected in series be enabled before a corresponding read/write operation will occur. For example, in order for the pass gates 26(0,0) through 26(0,W-1) to be effective, all of the write word lines 14-0 must be activated. Accordingly, the pass gates effectively form a W-way logical AND of the write word lines 14(0,0), 14(0,1) ..., 14(0,W-1).

The number of pass gates, W, which can be included to form a logical W-way AND can be any number. With current technology, typical values for W extend from 2 through 4.

In FIG. 3, the number of output ports is 2 times N. The practical range with current technology has N ranging from 1 to 4.

Figure 4:
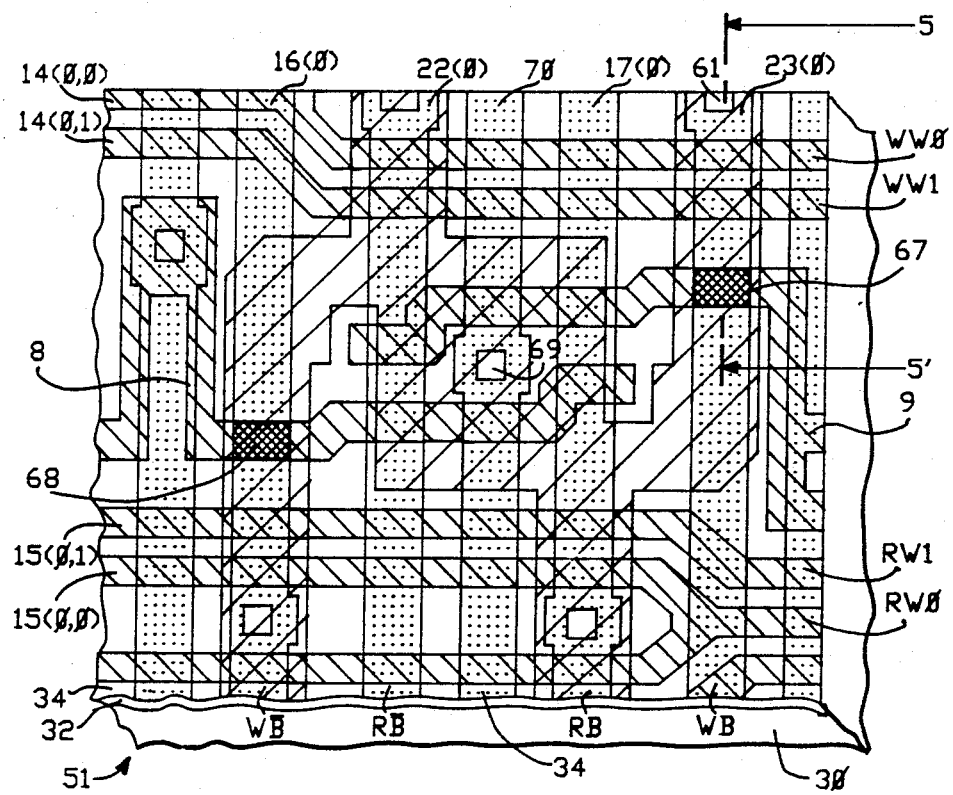
FIG. 4 depicts a top view of a cell layout for a CMOS structure embodying the present invention.
Figure 5:
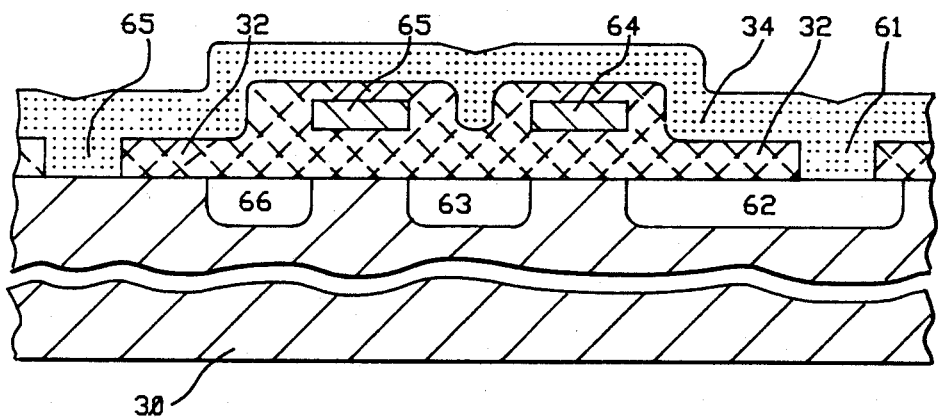
FIG. 5 depicts a cross-section of a portion of the FIG. 4 structure.

In FIG. 4, a memory cell 51, which is a portion of a CMOS semiconductor chip, is shown which represents the memory cell of FIG. 2. Referring to FIG. 5, a cross-section along the section line 5-5' of FIG. 4 is shown.

Referring to FIGS. 4 and 5, the cell is formed on a silicon base 30. The base 30 has n-type source and drain regions 31 deposited into the silicon base 30. Portions of the silicon base 30, with deposited source and drain regions, are covered with an insulating oxide layer 32. Encapsulated within the oxide layer are the word lines formed of polysilicon material and include the WW0 and WW write word lines 14(0,0) and 14(0,1), ad the RW0 and RW1 read word lines 15(0,0) and 15(0,1). On top of the oxide layer 32, a metal layer 34 is deposited to form the bit lines including the WB and $\overline{WB}$ write bit lines 23(0) and 16(0), and the RB and $\overline{RB}$ read bit lines 17(0) and 22(0).

In FIG. 5, the silicon base 30 includes the drain region 62 for the transistor 19-1 of FIG. 2 formed of the n-type material. The source region 63 for the transistor 19-1 is formed of n-type material and is located on the opposite side of the gate region below gate 64. Gate 64 is part of the polysilicon layer 33 and, specifically, the polysilicon WB write bit line 23(0) of FIG. 4.

In FIG. 5, the source region 63 for the transistor 19-1 also forms the drain region for the transistor 19-2. Transistor 19-2 has a gate region below the gate 65 and an n-type source region 66. The gate 65 is part of the polysilicon layer 33 and, specifically, is part of the WW1 write word line 14(0,1) of FIG. 4.

In FIGS. 4 and 5, the metal layer 34 extends through an opening in the oxide layer 32 to form the contact 61 which electrically connects the metal layer to the drain region 62 of transistor 19-1. Similarly, the Vcc (voltage) second latch conductor 9 extends across the oxide and makes a contact 67 with the silicon base 30, forming the X logic point for the latch circuit 5 of FIG. 2. The polysilicon conductor 9 extends past the contact 67 in FIG. 4 to form the gate region for transistor 6 of FIG. 2.

In FIG. 4, the first latch conductor 8 forms a contact 68 with the silicon base, like the contact 67 in FIG. 4 and in FIG. 5. The contact 68 is the $\overline{X}$ logic past contact 68 point for the latch 5 in FIG. 2. The conductor 8 extends past contact 68 in FIG. 4 to form the gate for the transistor 7 of FIG. 2. The contact 69 in FIG. 4 is the ground connection for the source regions of both transistors 6 and 7 connected in common, as also shown in FIG. 2. The ground conductor 70 in FIG. 4 is formed as part of the metallization layer 34.

Figure 6:
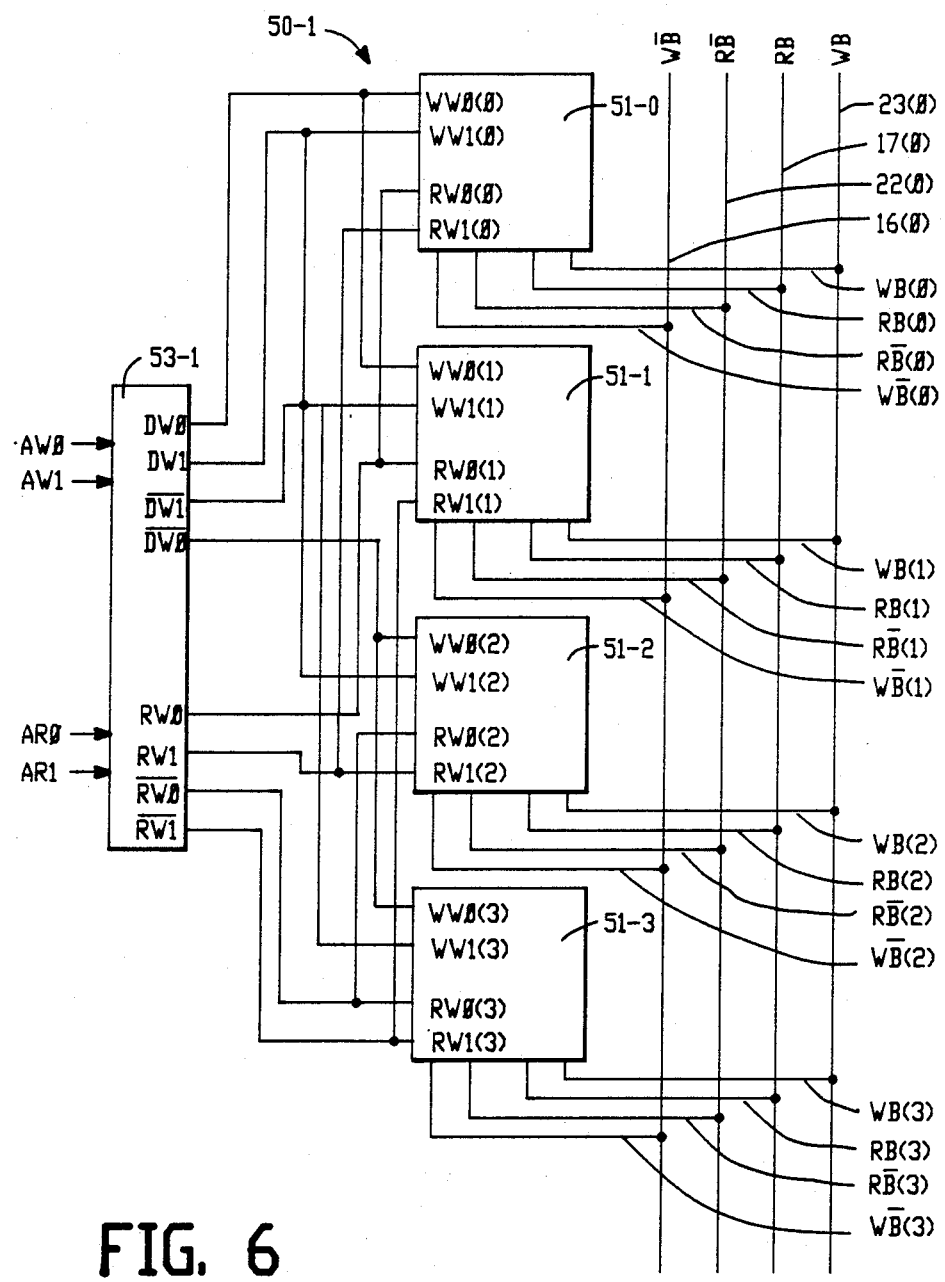
FIG. 6 depicts a memory unit formed of four memory cells of the FIG. 2 type.

In FIG. 6, an array of four cells 51-0, 51-1, 51-2, and 51-3 are combined with a decoder 53-1 to form a 4-bit by 1-bit memory unit 50-1.

The decoder 53-1 receives two input write address bits AW0 and AW1 and two input read address bits AR0 and AR1. The two input write address bits are decoded to four decoded write address lines DW0, DW1, $\overline{DW0}$ and $\overline{DW1}$. The two input read address bits are decoded to four decoded read address lines RW0, RW1, $\overline{RW0}$, and $\overline{RW1}$.

In FIG. 6, each of the memory cells 51-0, 51-1, 51-2 and 51-3 is like cell 51 in FIG. 2. The lines connected to the cells in FIG. 6 have the same numbers as in FIG. 2 with a subscript 0, 1, 2, or 3 corresponding to cells 51-0, 51-1, 51-2 and 51-3, respectively. Memory cell 51-0 is typical and has two write word lines WW0(0) and WW1(0), two read word lines RW0(0) and RW1(0), two write bit lines WB(0) and $\overline{WB}$(0), and two read bit lines RB(0) and $\overline{RB}$(0).

In FIG. 6, the decoded write word line DW0 connects in common to the write word lines WW0(0) and WW0(1). The decoded write word line DW1 connects in common to the write word lines WW1(0) and WW1(2). The decoded write word line DW1 connects in common to the write word lines WW1(1) and WW1(3). The decoded write word line DW0 connects in common to the write word lines WW0(2) and WW0(3).

In FIG. 6, the decoded read word line RW0 connects in common to the read word lines RW0(0) and RW0(1). The decoded read cord line RW1 connects in common to the read word lines RW1(0) and RW1(2). The decoded read word line RW0 connects in common to the read word lines RW0(2) and RW0(3). The decoded read word line RW1 connects in common to the read word lines RW1(1) and RW1(3).

In FIG. 6, all of the write bit lines WB(0), WB(1), WB(2) and WB(3) connect in common. All of the read bit lines RB(0), RB(1), RB(2), and RB(3) connect in common. All of the write bit lines $\overline{WB}$(0), $\overline{WB}$(1), $\overline{WB}$(2) and $\overline{WB}$(3) connect in common. All of the read bit lines $\overline{RB}$(0), $\overline{RB}$(1), $\overline{RB}$(2) and $\overline{RB}$(3) connect in common.

The operation of the FIG. 6 memory unit requires two write word lines to be energized for a write operation and two read word lines to be energized for a read operation. Each cell 51-0, 51-1, 51-2 and 51-3 in FIG. 6 operates like cell 51 in FIG. 2.

While a preferred embodiment of the present invention has been described in connection with FIG. 2 with two write word lines, WW0 and WW1, per cell and two read word lines, RW0 and RW1, per cell, the number of word lines is variable. One variation has been described in connection with FIG. 3 where the number W of word lines was variable and was the same for write word lines and read word lines. However, the number of write word lines may differ from the number of read word lines. For example, a single write word line together with two read word lines or two write word lines together with a single read word line may be employed. Referring to FIG. 2, for embodiment with a single write word line, WW0, and two read word line,, the WW1 line 14(0,1) is deleted and pass gates 18-1 and 19-1 are deleted. With such deletions, pass gate 18-0 connects directly to conductor 8 and pass gate 19-0 connects directly to conductor 9. In FIG. 1, the decoded write word line DW1 is also not needed.

In general, any number of write and read word lines of equal or unequal numbers may be employed. As a minimum, at least three word lines, two writes and a read or one write and two reads are required.

While the present invention has been described in connection with one semiconductor structure any unipolar structure may be employed including NMOS, CMOS, PMOS, and BICMOS.

While the present invention has been described in connection with W-way AND gates, W-way NOR gates and other logic functions can be performed within a memory cell using the principles of the present invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A memory cell comprising,
   a bistable latch circuit including first and second transistors, said latch circuit having said transistors cross-coupled such that for stable states, one transistor is conducting and the other transistor is non-conducting,
   first conductor means for conducting through said first transistor and second conductor means for conducting through said second transistor,
   a first write bit line,
   a plurality of first write pass gates connected between said first conductor means and said first write bit line,
   a second write bit line,
   a plurality of second write pass gates connected between said second conductor means and said second write bit line,
   a first read bit line
   a plurality of first read pass gates connected between said first conductor means and said first read bit line,
   a second read bit line,
   a plurality of second read pass gates connected between said second conductor means and said second read bit line,
   first and second write word lines, each write word line connected to one first write pass gate and to one second write pass gate,
   first and second read word lines, each read word line connected to one first read pass gate and one second read pass gate, whereby said latch circuit is accessed for writing by energizing both said first and second write word lines and is accessed for reading by energizing both said first and second read word lines.

2. The memory cell of claim wherein said memory cell is formed in a semiconductor chip having a semiconductor base, having said pass gates formed as unipolar transistors with source and drain regions in said base, having an insulating layer formed over said base and source and drain regions, and having gate conductors in said insulating layer and over regions between said source and drain regions to form the gates for said unipolar transistors, and having bit conductors supported by said insulating layer.

3. The memory cell of claim 2 wherein said semiconductor base is p-type material, wherein said source and drain regions are n-type material, wherein said insulating layer is an oxide material, wherein said gate conductors are polysilicon material, and wherein said bit conductors are metal.

4. A memory cell comprising,
   a bistable latch circuit including first and second transistors, said latch circuit having said transistors cross-coupled such that for stable states, one transistor is conducting and the other transistor is non-conducting,
   first conductor means for conducting through said first transistor and second conductor means for conducting through said second transistor,
   a plurality of first write bit lines; WB0, WB1, . . . , WB(N-1),
   a plurality of write pass gates connected between said first conductor means and each one of said first write bit lines,
   a plurality of second write bit lines; $\overline{WB}0$, $\overline{WB}1$, . . . , $\overline{WB}(N-1)$,
   a plurality of second write pass gates connected between said second conductor means and each one of said second write bit lines,
   a plurality of first read bit lines; RB0, RB1, . . . , RB(N-1),
   a plurality of first read pass gates connected between said first conductor means and each one of said first read bit lines,
   a plurality of second read bit lines; $\overline{RB}0$, $\overline{RB}1$, . . . , $\overline{RB}(N-1)$,
   a plurality of second read pass gates connected between said second conductor means and each one of said second read bit lines,
   a plurality of write word lines; WW0, WW1, . . . , WW(W-1); each write word line connected to a plurality of first write pass gates and to a plurality of second write pass gates,
   a plurality of read word lines; RW0, RW1, . . . , RW(W-1); each read word line connected to a plurality of first read pass gate and a plurality of second read pass gates, whereby said latch circuit is accessed for writing by energizing said plurality of first and second write word lines and is accessed for reading by energizing said plurality of first and second read word lines.

5. A memory unit comprising,
   decoder means for providing one or more pairs of first and second decoded write word lines and for providing one or more pairs of first and second decoded read word lines, and
   one or more memory cells, each memory cell uniquely connected to a different pair of said first and second decoded write word lines and uniquely connected to a different pair of said first and second decoded read word lines whereby the word line pairs are unique for every cell and Where each memory cell includes,
   a bistable latch circuit including first and second transistors, said latch circuit having said transistors cross-coupled such that for stable states, one transistor is conducting and the other transistor is non-conducting,
   first conductor means for conducting through said first transistor and second conductor means for conducting through said second transistor,
   a first write bit line,
   a plurality of write pass gates connected between said first conductor means and said first write bit line,
   a second write bit line,
   a plurality of second write pass gates connected between said second conductor means and said second write bit line,
   a first read bit line.

a plurality of first read pass gates connected between said first conductor means and said first read bit line, a second read bit line, a plurality of second read pass gates connected between said second conductor means and said second read bit line, first and second write word lines connected to said first and second decoded rite word lines, each write word line connected to one first write pass gate and to one second write pass gate, first and second read word lines connected to said first and second decoded read word lines, each read word line connected to one first read pass gate and one second read pass gate, whereby said latch circuit is accessed for writing when both said first and second write word lines are energized by both said first and second decoded write word lines connected to the cell and is accessed for reading when both said first and second read word lines are energized by both said first and second decoded read word lines connected to the cell.

6. A memory cell comprising, a bistable latch circuit including first and second transistors, said latch circuit having said transistors cross-coupled such that or stable states, one transistor is conducting and the other transistor is non-conducting, first conductor means for conducting through said first transistor and second conductor means for conducting through said second transistor, a first write bit line, one or more first write pass gates connected between said first conductor means and said first write bit line, a second write bit line, one or more second write pass gates connected between said second conductor means and said second write bit line, a first read bit line, one or more first read pass gates connected between said first conductor means and said first read bit line, a second read bit line, one or more second read pass gates connected between said second conductor means and said second read bit line, three or more word lines including at least one or more write word lines and one or more read word lines, each write word line connected to one first write pass gate and to one second write pass gate, each read word line connected to one first read pass gate and one second read pass gate, whereby said latch oircuit is accessed for writing by energizing said write word lines and is accessed for reading by energizing said read word lines.

7. The memory cell of claim 6 including two read word lines, two first read pass gates and two second read pass gates.

8. A memory cell comprising, a bistable latch circuit including first and second transistors, said latch circuit having said transistors cross-coupled such that for stable states, one transistor is conducting and the other transistor is non-conducting, first conductor means for conducting through said first transistor and second conductor means for conducting through said second transistor, a first write bit line, two first write pass gates connected between said first conductor means and said first write bit line, a second write bit line, two second write pass gates connected between said second conductor means and said second write bit line, a first read bit line, one or more first read pass gates connected between said first conductor means and said first read bit line, a second read bit line, one or more second read pass gates connected between said second conductor means and said second read bit line, three or more word lines including at least two write word lines and one or more read word lines, each write word line connected to one first write pass gate and to one second write pass gate, each read word line connected to one first read pass gate and one second read pass gate, whereby said latch circuit is accessed for writing by energizing said write word lines and is accessed for reading by energizing said read word lines.

9. A memory cell comprising, a bistable latch circuit including first and second transistors, said latch circuit having said transistors cross-coupled such that for stable states, one transistor is conducting and the other transistor is non-conducting, first conductor means for conducting through said first transistor and second conductor means for conducting through said second transistor, a first write bit line, two or more first write pass gates connected between said first conductor means and said first write bit line, a second write bit line, two or more second write pass gates connected between said second conductor means and said second write bit line, a first read bit line, two or more first read pass gates connected between said first conductor means and said first read bit line, a second read bit line, two or more second read pass gates connected between said second conductor means and said second read bit line, three or more word lines including at least two or more write word lines and two or more read word lines, each write word line connected to one first write pass gate and to one second write pass gate, each read word line connected to one first read pass gate and one second read pass gate, whereby said latch circuit is accessed for writing by energizing said write word lines and is accessed for reading by energizing said read word lines.

10. A memory cell formed in a semiconductor chip having a semiconductor base, having pass gates formed as unipolar transistors with source and drain regions in said base, having an insulating layer formed over said base and source and drain regions, and having gate conductors in said insulating layer and over regions between said source and drain regions to form the gates for said unipolar transistors, and having bit conductors supported by said insulating layer comprising,

- a bistable latch circuit including first and second transistors, said latch circuit having said transistors cross-coupled such that for stable states, one transistor is conducting and the other transistor is non-conducting,
- first conductor means for conducting through said first transistor and second conductor means for conducting through said second transistor,
- a first write bit line,
- one or more first write pass gates connected between said first conductor means and said first write bit line,
- a second write bit line,
- one or more second write pass gates connected between said second conductor means and said second write bit line,
- a first read bit line,
- one or more first read pass gates connected between said first conductor means and said first read bit line,
- a second read bit line,
- one or more second read pass gates connected between said second conductor means and said second read bit line,
- three or more word lines including at least one or more write word lines and one or more read word lines,
- each write word line connected to one first write pass gate and to one second write pass gate,
- each read word line connected to one first read pass gate and one second read pass gate, whereby said latch circuit is accessed for writing by energizing said write word lines and is accessed for redding by energizing said read word lines.

11. The memory cell of claim 10 wherein said semiconductor base is p-type material, wherein said source and drain regions are n-type material, wherein said insulating layer is an oxide material, wherein said gate conductors are polysilicon material, and wherein said bit conductors are metal.

* * * * *